United States Patent
Witcraft et al.

(10) Patent No.: US 6,914,805 B2
(45) Date of Patent: Jul. 5, 2005

(54) METHOD FOR BUILDING A MAGNETIC KEEPER OR FLUX CONCENTRATOR USED FOR WRITING MAGNETIC BITS ON A MRAM DEVICE

(75) Inventors: William F. Witcraft, Minneapolis, MN (US); Lonny Berg, Elk River, MN (US); Alan Hurst, Anoka, MN (US); William Vavra, Maple Plain, MN (US); Mark Jenson, Zimmerman, MN (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/226,623

(22) Filed: Aug. 21, 2002

(65) Prior Publication Data

US 2004/0037109 A1 Feb. 26, 2004

(51) Int. Cl.$^7$ .............................................. G11C 11/00
(52) U.S. Cl. ........................ 365/158; 365/55; 365/57; 365/63; 365/171
(58) Field of Search ........................ 365/158, 55, 57, 365/33, 63, 171

(56) References Cited

U.S. PATENT DOCUMENTS

| | | | |
|---|---|---|---|
| 3,623,032 A | 11/1971 | Schapira | |
| 3,623,035 A | 11/1971 | Kobayashi et al. | |
| 3,816,909 A | 6/1974 | Maeda et al. | |
| 3,947,831 A | 3/1976 | Kobayashi et al. | |
| 4,044,330 A | 8/1977 | Johnson et al. | |
| 4,060,794 A | 11/1977 | Feldman et al. | |
| 4,158,891 A | 6/1979 | Fisher | |
| 4,455,626 A | 6/1984 | Lutes | |
| 4,731,757 A | 3/1988 | Daughton et al. | |
| 4,780,848 A | 10/1988 | Daughton et al. | |
| 4,918,655 A | 4/1990 | Daughton | |
| 5,039,655 A | 8/1991 | Pisharody | |
| 5,064,499 A | 11/1991 | Fryer | |
| 5,140,549 A | 8/1992 | Fryer | |
| 5,432,734 A | 7/1995 | Kawano et al. | |

(Continued)

FOREIGN PATENT DOCUMENTS

| | | |
|---|---|---|
| JP | 2000 090658 A | 3/2000 |
| WO | WO 00 72324 A | 11/2000 |

OTHER PUBLICATIONS

Pohm et al., "The Architecture of a High Performance Mass Store with GMR Memory Cells," IEEE Transactions on Magnetics, vol. 31, No. 6, Nov. 1995.

(Continued)

*Primary Examiner*—Richard Elms
*Assistant Examiner*—Toan Le
(74) *Attorney, Agent, or Firm*—Knobbe, Martens, Olson & Bear, LLP (57) ABSTRACT

An MRAM device comprising an array of MRAM elements, with each element having an MRAM bit influenced by a magnetic field from a current flowing through a conductor, also includes a magnetic keeper formed adjacent the conductor to advantageously alter the magnetic field. The magnetic keeper alters the magnetic field by concentrating the field within the keeper thereby reducing the extent in which fringe field exists, thus allowing the MRAM elements to be formed closer to increase the areal density of the MRAM device. Increase in magnetic field flux due to the magnetic keeper allows operation of the MRAM device with lowered power. Soft magnetic materials such as nickel iron, nickel iron cobalt, or cobalt iron may be used to form the magnetic keeper.

41 Claims, 6 Drawing Sheets

U.S. PATENT DOCUMENTS

| | | | |
|---|---|---|---|
| 5,496,759 | A | 3/1996 | Yue et al. |
| 5,547,599 | A | 8/1996 | Wolfrey et al. |
| 5,569,617 | A | 10/1996 | Yeh et al. |
| 5,587,943 | A | 12/1996 | Torok et al. |
| 5,661,062 | A | 8/1997 | Prinz |
| 5,741,435 | A | 4/1998 | Beetz, Jr. et al. |
| 5,846,881 | A | 12/1998 | Sandhu et al. |
| 5,861,328 | A | 1/1999 | Tehrani et al. |
| 5,902,690 | A | 5/1999 | Tracy et al. |
| 5,940,319 | A | 8/1999 | Durlam et al. |
| 5,956,267 | A | 9/1999 | Hurst et al. |
| 6,007,733 | A | 12/1999 | Jang et al. |
| 6,048,739 | A | 4/2000 | Hurst et al. |
| 6,048,789 | A | 4/2000 | Vines et al. |
| 6,165,803 | A | 12/2000 | Chen et al. |
| 6,174,737 | B1 | 1/2001 | Durlam et al. |
| 6,211,090 | B1 | 4/2001 | Durlam et al. |
| 6,413,788 | B1 | 7/2002 | Tuttle |
| 6,417,561 | B1 | 7/2002 | Tuttle |
| 6,475,812 | B2 | 11/2002 | Nickel et al. |
| 6,510,078 | B2 | 1/2003 | Schwarzl |
| 6,555,858 | B1 | 4/2003 | Jones |
| 6,556,473 | B2 | 4/2003 | Saito et al. |
| 6,580,636 | B2 | 6/2003 | Thewes et al. |
| 6,661,688 | B2 * | 12/2003 | Bloomquist et al. .......... 365/63 |
| 2004/0032010 | A1 * | 2/2004 | Kools et al. ................ 257/659 |
| 2004/0057295 | A1 * | 3/2004 | Matsukawa et al. ........ 365/200 |

OTHER PUBLICATIONS

Pohm et al., "Experimental and Analytical Properties of 0.2 Micron Wide, Multi–Layer, GMR, Memory Elements", IEEE Transactions on Magnetics, vol. 32, No. 5, Sep. 5, 1996.

Prinz, "Magnetoelectronics", Science Magazine, vol. 282, Nov. 27, 1998.

Wang et al., Feasibiity of Ultra–Dense Spin–Tunneling Random Access Memory, IEEE Transactions on Magnetics, vol. 33, No. 6, Nov. 1997.

M. Durlam, et al. "A low power 1Mbit MRAM based on 1T1MTJ bit cell integrated with Copper Interconnects," 2002 Symposium on VLSI Circuits, Digest of Technical Papers (IEEE Jun. 2002), pp. 158–161.

Daughton, James, "Magnetoresistive Random Access Memory (MRAM)" Feb. 4, 2000.

Daughton, James M. "Advanced MRAM Concepts", NVE Corporation, Feb. 7, 2001.

Lee, Chih–Ling, "A Study of Magnetoresistance Random–Access Memory".

Honeywell Brochure, "Non–Volatile Memory (MRAM)", Solid State Electronics Center, Mar. 1999.

Nave, C.R. *Ferromagnetism* [online], Georgia State University, [retrieved on Jan. 6, 2005]. Retrieved from the Internet <URL:http://hyperphysics.phy–astr.gsu.edu/hbase/solids/ferro.html>, pp. 1–5.

Nave, C.R., *Magnetic Susceptibilities of Paramagnetic and Diamagnetic Materials at 20° C.* [online], Georgia State University, retrieved from the Internet <URL: http://hyperphysics.phy–astr.gsu.edu/hbase/tables/magprop.html#c2>.

* cited by examiner

METHOD FOR BUILDING A MAGNETIC KEEPER OR FLUX CONCENTRATOR USED FOR WRITING MAGNETIC BITS ON A MRAM DEVICE

This invention was made with Government support under Contract Number N00014-96-C-2114 awarded by NRL (Naval Research Laboratory). The Government has certain rights in this invention.

BACKGROUND OF THE INVENTION

1. Field of the Invention

The invention relates to semiconductor processing technology and, in particular, concerns a magnetoresistive random access memory (MRAM) device and method of fabricating the same.

2. Description of the Related Art

MRAM is a memory device that comprises a plurality of bits or elements that can be in at least two logic states in a non-volatile manner. Each bit comprises a magnetoresistive (MR) material whose electrical resistance varies with the magnetization of the MR material. Thus, selective magnetization of the bit's MR material permits the bit to be programmed into different resistive states.

To alter the state of the MRAM bit, a sufficiently strong magnetic field with a predetermined field pattern is applied to the bit, causing the net magnetization of the bit to be altered, and remain altered after the field is removed. Such magnetic field is typically generated by a current flowing through a conductor adjacent to the bit.

The conductors that provide the magnetic field for altering the state of the bits typically form a grid pattern, and the bits are typically located at the intersections of the grid. Thus, to alter the state of a bit that is located at a given intersection, selected currents are passed through the two intersecting conductors. The selected currents are selected such that magnetization of the bit changes only when subjected to a net magnetic field due to both of the selected currents.

The bits and the conductors in two dimensional grid permits efficient arrangement of the bits, as well as addressing the bits. The spacing between adjacent bits partially determines the memory density of the MRAM. One of the factors that limit how close bits can be positioned is determined by magnetic field patterns generated by the conductors. As is known in the art, a magnetic field generally loops around the cross section of the conductor, and the field strength decreases as distance from the axis of the conductor increases. The MRAM bit is positioned from the conductor (more precisely, from intersecting conductors) such that the net magnetic field due to selected currents is able to magnetize the bit in a desired manner.

Any magnetic field beyond the intended use range is loosely referred to as a fringe field, and can extend beyond the intended bit significantly. Even though the field strength decreases with distance, the fringe field may be sufficiently strong enough to at least partially affect the magnetization of an adjacent bit. Thus the MRAM is limited in its density when using traditional implementation of the magnetic field producing conductors.

SUMMARY OF THE INVENTION

In one aspect, the aforementioned needs are satisfied by an MRAM device comprising an MRAM bit having a magnetoresistive material whose electrical resistance depends on the magnetization of the magnetoresistive material. The change in the resistance permits the bit to be in different states. The device further comprises a magnetic field generating member positioned adjacent the bit. The magnetic field generating member generates a magnetic field that alters the magnetization of the bit. The device further comprises a magnetic keeper member positioned adjacent the magnetic field generating member such that the magnetic keeper member shapes the pattern of the magnetic field generated by the magnetic field generating member.

In one embodiment, the magnetic field generating member comprises a conductor that permits an electrical current to flow therethrough thereby generating the magnetic field. The magnetic keeper member comprises a soft magnetic material that captures and concentrates the magnetic field therein so as to alter the overall magnetic field pattern generated by the magnetic field generating member. The soft magnetic material captures and concentrates the magnetic field therein by having a relatively higher magnetic permeability value than that of its surrounding materials. The magnetic permeability of the soft magnetic material is approximately 100 times or higher than that of its surrounding material. The magnetic field pattern altered by the magnetic keeper member has a reduced fringe magnetic field.

In one embodiment, the soft magnetic material may comprise materials such as nickel iron (NiFe), nickel iron cobalt (NiFeCo), or cobalt iron (CoFe). The magnetic keeper member has a thickness in the range of approximately 100–1000 angstroms. More preferably, the thickness is approximately 200 angstroms.

In one embodiment, the magnetic keeper member and the MRAM bit are disposed on opposite sides of the conductor. In another embodiment, the magnetic keeper member forms a U-shape about the conductor in cross section. The U-shaped magnetic keeper member comprises a base section and two side sections and the MRAM bit is disposed adjacent the side of the conductor that is opposite from the base section of the U-shaped magnetic keeper member.

In another aspect, the aforementioned needs are satisfied by an MRAM array comprising a plurality of MRAM bits arranged in a selected manner, and a plurality of conductors adapted to permit flow of current therethrough. The current flowing through the conductor generates a magnetic field and the plurality of conductors are arranged such that the magnetic field can be applied to a selected MRAM bit so as to alter the state of the selected MRAM bit. The array further comprises a plurality of magnetic keeper members positioned adjacent the conductors such that the magnetic keeper members shape the magnetic field generated by the conductors so as to permit improved arrangement of the MRAM bits and the conductors in the MRAM array.

In one embodiment, each conductor has associated with it a corresponding magnetic keeper member. The magnetic keeper member comprises a soft magnetic material and the magnetic keeper member extends in a generally parallel manner to the conductor. The soft magnetic material provides a preferred path for the magnetic field by having a higher value of relative magnetic permeability than that of its surrounding material. Preferably, the magnetic permeability of the soft magnetic material is approximately 100 times or higher than that of its surrounding material. The soft magnetic material may comprise materials such as nickel iron (NiFe), nickel iron cobalt (NiFeCo), or cobalt iron (CoFe).

In yet another aspect, the aforementioned needs are satisfied by a process for forming an MRAM device having a conductor and an MRAM bit. An electrical current flowing through the conductor generates a magnetic field that alters the state of the MRAM bit. The process comprises forming a magnetic keeper member about the conductor and relative to the MRAM bit such that the magnetic keeper member alters the magnetic field generated by the current flowing through the conductor.

In one implementation, forming the magnetic keeper member about the conductor and relative to the MRAM bit comprises steps of: forming a magnetic keeper layer on a substrate; patterning the magnetic keeper layer to form the magnetic keeper member wherein the magnetic keeper member is dimensioned to permit shaping of the magnetic field in a desired manner; forming a barrier layer about the magnetic keeper member; forming the conductor on the barrier layer; and forming the MRAM bit above the conductor. In one implementation, forming the magnetic keeper further comprises forming an adhesion/barrier layer on the substrate prior to forming the magnetic keeper layer. In one implementation, forming the magnetic keeper further comprises forming an anti-reflective barrier layer on the conductor prior to forming the MRAM bit above the conductor. In one embodiment, the substrate comprises a dielectric material.

In one implementation, forming the magnetic keeper layer comprises depositing a soft magnetic material. The soft magnetic material provides a preferred path for the magnetic field by having a higher value of relative magnetic permeability than that of its surrounding material. The magnetic permeability of the soft magnetic material is approximately 100 times or higher than that of its surrounding material. The soft magnetic material may be materials such as nickel iron (NiFe), nickel iron cobalt (NiFeCo), or cobalt iron (CoFe).

In one implementation, the magnetic keeper layer has a thickness in the range of approximately 100–1000 angstroms. More preferably, the magnetic keeper layer has a thickness of approximately 200 angstroms.

In one implementation, patterning the magnetic keeper layer to form the magnetic keeper member comprises forming a mask pattern above the magnetic keeper layer and removing portion of the magnetic keeper layer not covered by the mask pattern. Forming the mask pattern comprises forming a tantalum nitride (TaN) layer on the magnetic keeper layer and patterning the TaN layer by photolithography and plasma etching. The magnetic keeper layer not covered by the mask pattern may be removed by techniques such as sputter etching ion milling.

In one implementation, forming the barrier layer about the magnetic keeper member comprises depositing titanium tungsten about the magnetic keeper member so as to cover the sides and top of the magnetic keeper member. Forming the conductor comprises depositing material such as aluminum copper (AlCu) on to of the barrier layer. In one implementation, soft magnetic material is deposited adjacent the sides of the conductor to further concentrate the magnetic field.

In one implementation, forming the magnetic keeper member about the conductor and relative to the MRAM bit comprises steps of: forming the MRAM bit on a substrate; forming the conductor above the MRAM bit; forming a barrier layer on the conductor; and patterning the magnetic keeper layer on the barrier layer to form the magnetic keeper member wherein the magnetic keeper member is dimensioned to permit shaping of the magnetic field in a desired manner. In one implementation, the forming the magnetic keeper member further comprises forming magnetic keeper walls adjacent the sides of the conductor to further concentrate the magnetic field.

In yet another aspect, the aforementioned needs are satisfied by a method of forming an array of MRAM elements. Each MRAM element comprises an MRAM bit and a conductor nearby. A magnetic field produced by a current flowing through the conductor alters the state of the MRAM bit. The method comprises forming a magnetic keeper member adjacent each of the plurality of conductors such that the magnetic keeper member shapes the magnetic field in a manner that permits the MRAM elements to be arranged closer in the MRAM array.

In one implementation, forming the magnetic keeper member comprises depositing a soft magnetic material adjacent each of the conductors. The soft material may be materials such as nickel iron (NiFe), nickel iron cobalt (NiFeCo), or cobalt iron (CoFe).

In yet another aspect, the aforementioned needs are satisfied by an MRAM device comprising an MRAM bit having a magnetoresistive material whose electrical resistance depends on the magnetization of the magnetoresistive material. The change in the resistance permits the bit to be in different states. The device further comprises a conductor positioned adjacent the bit. A current flowing through the conductor generates a flux of magnetic field at a location occupied by the bit and a magnetic field flux greater than a first value alters the magnetization of the bit. The device further comprises a magnetic keeper member positioned adjacent the conductor such that the magnetic keeper member increases the magnetic field flux at the bit location thereby allowing use of a lower current to alter the magnetization of the bit.

In one embodiment, the magnetic keeper member comprises a soft magnetic material that captures and concentrates the magnetic field therein so as to alter the overall magnetic field pattern generated by the conductor. The soft magnetic material captures and concentrates the magnetic field therein by having a relatively higher magnetic permeability value than that of its surrounding materials. Preferably, the magnetic permeability of the soft magnetic material is approximately 100 times or higher than that of its surrounding material. The soft magnetic material may be materials such as nickel iron (NiFe), nickel iron cobalt (NiFeCo), or cobalt iron (CoFe).

In one embodiment, the magnetic keeper member has a thickness in the range of approximately 100–1000 angstroms. More preferably, the magnetic keeper member has a thickness of approximately 200 angstroms.

In one embodiment, the magnetic keeper member and the MRAM bit are disposed on opposite sides of the conductor. In another embodiment, the magnetic keeper member forms a U-shape about the conductor in cross section. The U-shaped magnetic keeper member comprises a base section and two side sections and the MRAM bit is disposed adjacent the side of the conductor that is opposite from the base section of the U-shaped magnetic keeper member.

In yet another aspect, the aforementioned needs are satisfied by an MRAM device comprising an MRAM bit having a magnetoresistive material whose electrical resistance depends on the magnetization of the magnetoresistive material. The change in the resistance permits the bit to be in different states. The device further comprises a conductor positioned at a first distance from the bit. A current flowing through the conductor generates a magnetic field flux at the bit location and alters the magnetization of the bit if the flux is greater than a first value. The device further comprises a flux concentrator component that concentrates the magnetic field flux therein thereby also increasing the flux at the bit location. The increase in the flux at the bit location allows reduction in power required to provide the flux greater than the first value at the bit location.

In one embodiment, the flux concentrator comprises a soft magnetic material layer adjacent to the conductor on the side away from the bit. The soft magnetic material provides a preferred path for the magnetic field by having a higher value of relative magnetic permeability than that of its surrounding material. Preferably, the magnetic permeability of the soft magnetic material is approximately 100 times or higher than that of its surrounding material. In one embodiment, the soft magnetic material layer comprises a layer that has a thickness in the range of approximately 100–1000 angstroms. Preferably, the thickness is approximately 200 angstroms. The soft magnetic material may be materials such as nickel iron (NiFe), nickel iron cobalt (NiFeCo), or cobalt iron (CoFe).

DETAILED DESCRIPTION OF THE PREFERRED EMBODIMENT

Figure 1:
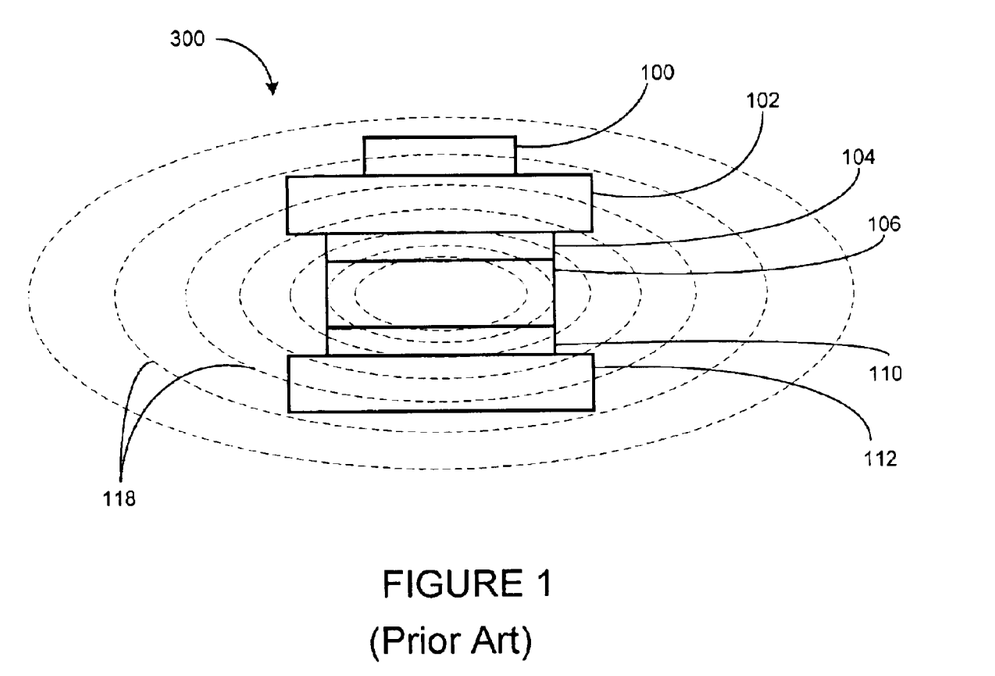
FIG. 1 illustrates a conventional MRAM element.

Reference will now be made to the drawings wherein like numerals refer to like parts throughout. FIG. 1 illustrates a cross section of a conventional MRAM element 300 comprising an MRAM bit 100 positioned near a conductor 106 such that a current flowing through the conductor 106 generates a magnetic field 118 in a manner known in the art. In FIG. 1, the MRAM element 300 is illustrated to show a cross section of the conductor 106, and as such, the direction of the current is perpendicular to the plane of illustration. The direction of the magnetic field 118 is intentionally left ambiguous to represent either of the two possible current directions. As is understood in the art, if the current direction is into the plane of illustration, the magnetic field is directed in a clockwise direction. Conversely, if the current direction is out of the plane of illustration, the magnetic field is directed in a counter-clockwise direction.

The conventional MRAM element 300 illustrated in FIG. 1 further comprises a first substrate layer 112 positioned below the conductor 106, and a first barrier layer 110 interposed between the conductor 106 and the first substrate layer 112. The first substrate layer 112 provides structural support for the MRAM element 300, and may be formed from non-conducting material such as a dielectric material. The first barrier layer 110 generally forms a protective barrier during a patterning process that facilitates patterning of underlying features. The first barrier layer 110 also generally promotes adhesion of a layer that is to be formed thereon.

The conventional MRAM element 300 further comprises a second barrier layer 104 formed on top of the conductor 106, and a second substrate layer 102 formed on top of the second barrier layer 104. The second substrate layer 102 also provides structural support for the MRAM element 300, and may be formed from non-conducting material such as a dielectric material. The second substrate layer 102 also provides a surface on which the MRAM bit 100 and its associated interconnects (not shown) may be formed in a manner that is known in the art.

The spacing between the conductor 106 and the MRAM bit 100, and the magnitude of the current flowing through the conductor 106 are selected to allow the magnetic field 118 to alter the state of the MRAM bit 100. When such magnetic field is established, the field may extend into a region occupied by an adjacent MRAM element and thereby have undesirable effects. The unwanted field at the periphery of the magnetic field pattern is typically termed as a "fringe field". Description hereinafter in reference to FIGS. 2–7 relate to various embodiments of MRAM elements wherein the fringe field is mitigated so as to provide advantages described below.

Figure 2:
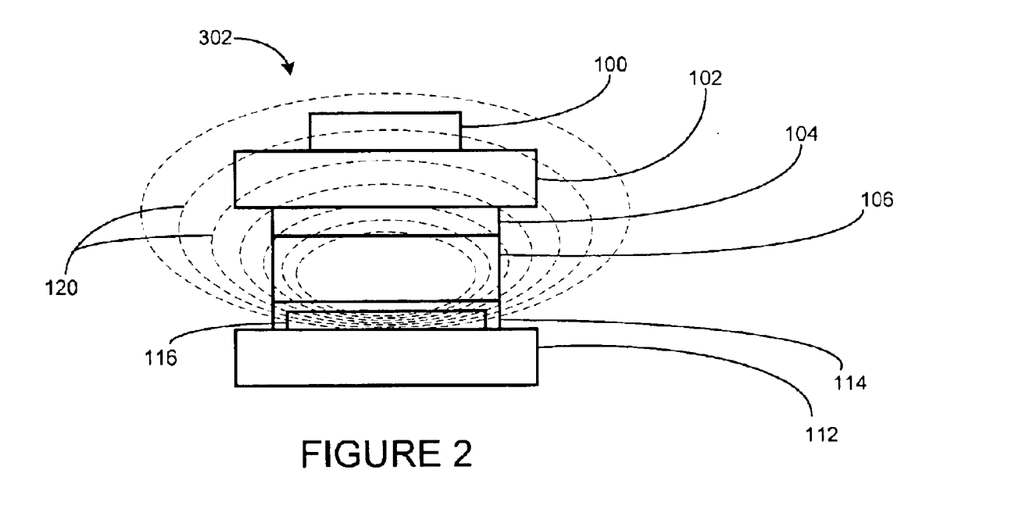
FIG. 2 illustrates one embodiment of an MRAM element having a magnetic keeper positioned below a conductor and an MRAM bit positioned above the conductor.

FIG. 2 illustrates an MRAM element 302 comprising a magnetic keeper 116 that alters the shape of a magnetic field 120 generated when the current flows through the conductor 106. In one embodiment, the MRAM element 302 comprises the first and second substrate layers 112, 102 and the conductor 106 interposed therebetween in a manner similar to the element 300 described above in reference to FIG. 1. Furthermore, the MRAM bit 100 is formed on top of the second substrate layer 102, and the second barrier layer 104 is interposed between the conductor 106 and the second substrate layer 102 in a similar manner.

The MRAM element 302 further comprises a first barrier layer 114 interposed between the first substrate layer 112 and the conductor 106. Interposed between the first barrier layer 114 and first substrate layer 112 is the magnetic keeper layer 116 that concentrates a portion of the magnetic field 120 so as to advantageously alter the extent and strength of the fringe field in a manner described below. Thus when compared to the MRAM element 300 of FIG. 1, the fringe field of the magnetic field 120 does not extend laterally as much as that of the magnetic field 118. This feature permits a plurality of MRAM elements to be positioned closer to each other so as to increase the areal density of the MRAM device.

In one embodiment, the magnetic keeper layer 116 is formed from a soft magnetic material such as nickel iron (NiFe), nickel iron cobalt (NiFeCo), cobalt iron (CoFe), and the like. Further details on dimensions and compositions of the magnetic keeper and other parts of the MRAM element 302 are elaborated in greater detail below in the description of the fabrication process.

As is understood, a measure of how easily a flux of magnetic field can be set up in a given material (magnetized) depends on a property called permeability. A material with higher permeability can be magnetized easier. Magnetic materials such as the above mentioned materials have permeability values that are approximately 100 times or higher than that of a non-magnetic material. Because magnetic field lines tend to follow a path of least resistance, and because high permeability yields lower resistance to establishment of magnetic flux, a magnetic material in presence a magnetic field causes the field lines to redistribute themselves so as to go through the magnetic material as much as possible, rather than through the non-magnetic material.

Thus in FIG. 2, the magnetic keeper 116, being formed from a magnetic material with relatively high permeability, causes the exemplary magnetic field 120 to be redistributed such that the field lines below the conductor 106 concentrate through the keeper 116. Consequently, the overall pattern of the magnetic field 120 is advantageously altered. It will be appreciated that the keeper illustrated in FIG. 2 is just one possible configuration. Some of other possible configurations of the magnetic keeper are described below. When used in MRAM elements, the magnetic keepers allow the generated magnetic field patterns to be controlled in an advantageous manner. In particular, the magnetic field pattern resulting from a given conductor can be altered by the magnetic keeper so as to reduce the range of the fringe field. As described below, such reduction in the range of the fringe field allows the neighboring MRAM elements to be formed closer to a given MRAM element, thereby advantageously increasing the areal density of the resulting MRAM device.

Figure 3:
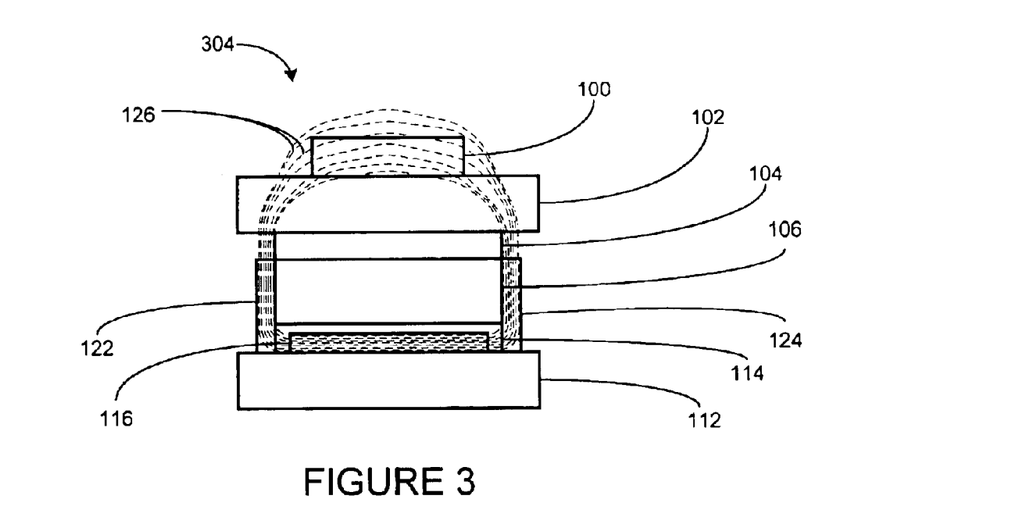
FIG. 3 illustrates a variation to the MRAM element of FIG. 2 wherein the magnetic keeper includes sections that extend along the sides of the conductor.

FIG. 3 illustrates another embodiment of MRAM element that includes additional magnetic keepers to further mitigate the fringe field. In particular, an MRAM element 304, similar to the element 302 described above in reference to FIG. 2, further comprises a first side magnetic keeper 122 and a second side magnetic keeper 124. The first side magnetic keeper 122 extends vertically in cross section adjacent one lateral end of the conductor 106, and the second magnetic keeper 124 extends vertically in cross section adjacent the other lateral end of the conductor 106. As such, the magnetic keeper layer 116 and the first and second side magnetic keepers 122, 124 form a "U" shaped cross section. When magnetic field is generated due to the current flowing through the conductor 106, the aforementioned magnetic keepers concentrate the field lines generally within the U-shaped keepers, thereby yielding a magnetic field pattern 126 that is more localized than that described above in reference to FIGS. 1 and 2.

Figure 4:
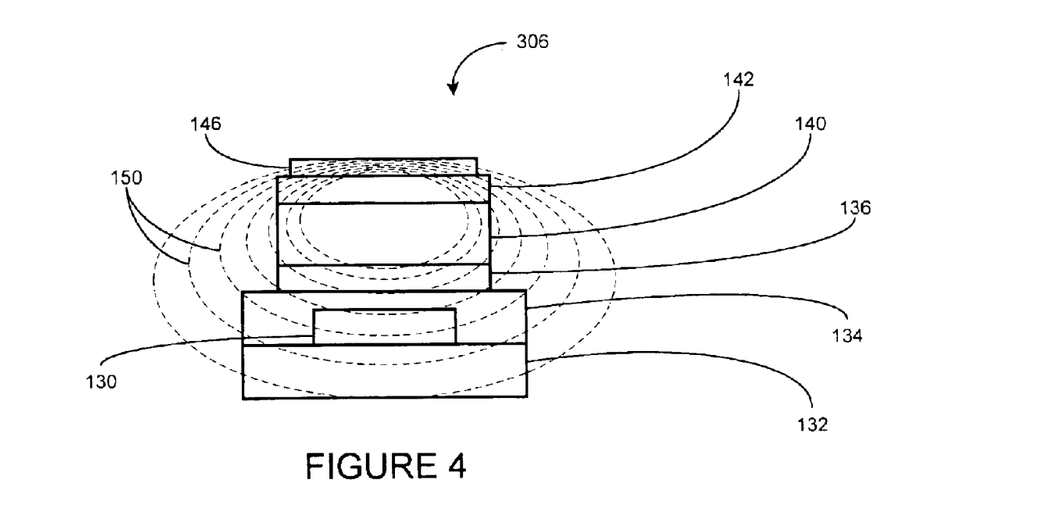
FIG. 4 illustrates yet another embodiment of the MRAM element wherein the magnetic keeper is positioned above the conductor and the MRAM bit is positioned below the conductor.

FIG. 4 illustrates another embodiment of an MRAM element 306 comprising an MRAM bit 130 located below a conductor 140. In particular, the element 306 comprises a first substrate layer 132 on which the bit 130 is formed along with its associated interconnects (not shown). A second substrate layer 134 is surrounds the lateral and top sides of the bit 130 so as to encapsulate the bit between the first and second substrate layers 132, 134. The element 306 further comprises a first barrier layer 136 formed on top of the second substrate layer 134, and the conductor 140 formed on top of the first barrier layer 136. A second barrier layer 142 is formed on top of the conductor 140, and a magnetic keeper layer 146 is formed on top of the second barrier layer 142. Thus, the magnetic keeper layer 146 concentrates the magnetic field therein thereby yielding a field pattern 150. As such, the magnetic field pattern has fringe field that extends less than a counterpart element (not shown) without the magnetic keeper.

Figure 5:
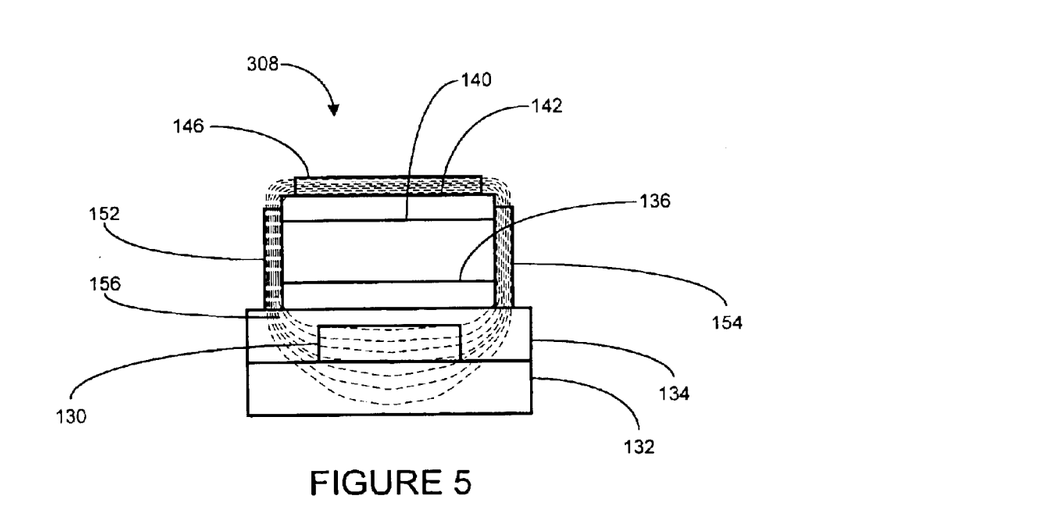
FIG. 5 illustrates a variation to the MRAM element of FIG. 4 wherein the magnetic keeper includes sections that extend along the sides of the conductor.

FIG. 5 illustrates an alternate embodiment to the element 306 described above in reference to FIG. 4. In particular, an MRAM element 308, similar to the element 306 of FIG. 4, further comprises a first and a second side magnetic keeper 152 and 154 positioned adjacent the lateral ends of the conductor 140. As such, the magnetic keeper layer 146 and the first and second side magnetic keepers 152, 154 form an inverted "U" shape, concentrating the magnetic field therein to yield a field pattern 156 that is more localized than that of the element 306 described above.

Figure 6:
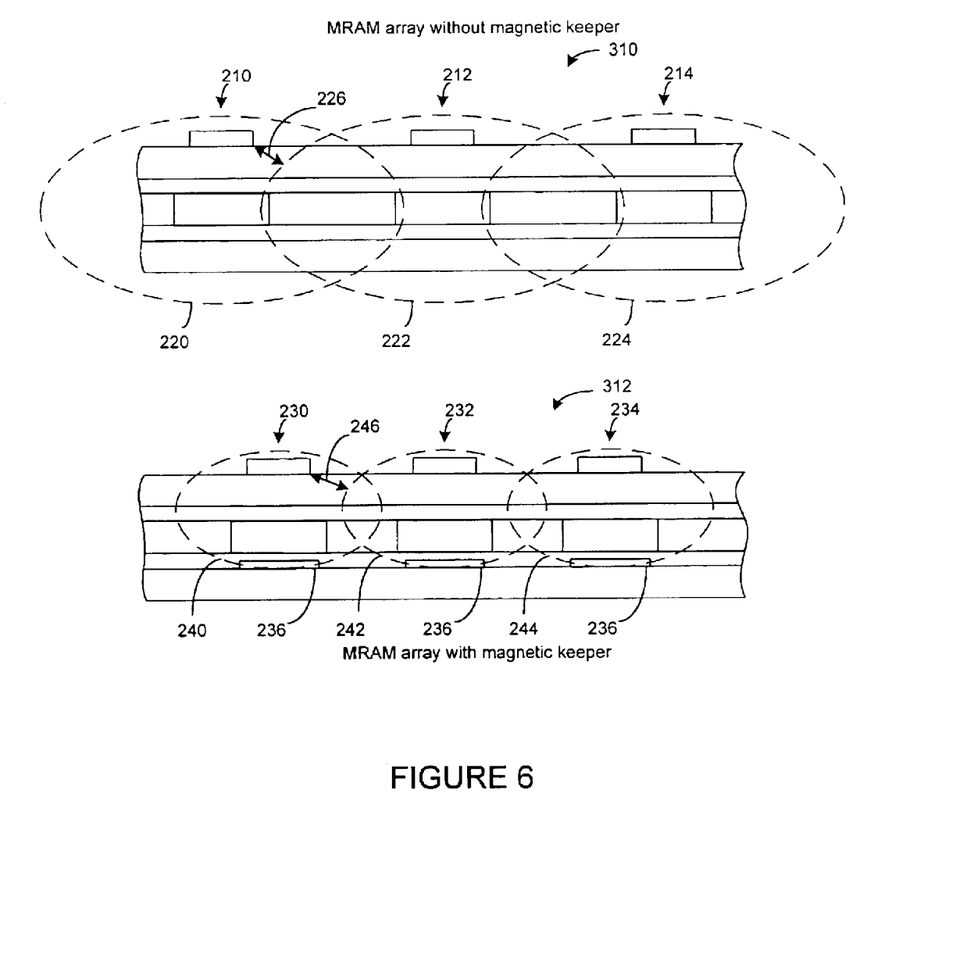
FIG. 6 illustrates one possible advantage provided by the magnetic keeper wherein the magnetic keepers allow MRAM elements in an array to be positioned closer to each other thereby increasing the areal density of the MRAM elements.

FIG. 6 illustrates a comparison between a conventional MRAM array 310 without magnetic keepers and an exemplary MRAM array 312 with magnetic keepers 236. In particular, the conventional array 310 comprises a plurality of MRAM elements, three of which are shown as elements 210, 212, and 214. Each of the elements may be similar to the conventional element described above in reference to FIG. 1. Associated with each element is a magnetic field, and for descriptive purpose, a boundary of magnetic field influence (fringe field) is depicted, wherein at locations inside the boundary a sufficiently strong magnetic field can exist so as to affect the state of an MRAM bit. Thus, boundaries of influence 220, 222, 224 are respectively associated with the elements 210, 212, 224. Given such range of magnetic field influence, the elements are spaced apart to allow a selected margin 226 between the boundary and the bit associated with the adjacent element. Such a spacing requirement imposes a limitation on how close neighboring MRAM elements can be positioned, and thus limits the areal density of the MRAM array.

As shown in FIG. 6, the array 312 comprises a plurality of MRAM elements, three of which are shown as elements 230, 232, and 234. Each element is similar to the element 302 described above in reference to FIG. 2. It will be appreciated, however, that other embodiments of the element may be used in the array without departing from the spirit of the invention. Associated with the three elements 230, 232, 234 are boundaries of magnetic field influence 240, 242, 244, respectively. As previously described, the presence of the magnetic keeper in a given element reduces the extent of the fringe field, thereby reducing the extent of the boundary.

Furthermore, associated with each boundary is a selected margin 246 that separates the boundary to the neighboring element's bit. Thus, with the arrays 310 and 312 being substantially similar other than the presence of the magnetic keepers 236 in the array 312, the selected margin 246 in the array 312 is similar to the selected margin 226 in the array 310. Because the boundary associated with each element in the array 312 is of smaller dimension, the elements in that array may be brought closer to each other while maintaining the minimum selected margin 246. Thus, the magnetic keepers allow the array to have an increased areal density of elements.

FIGS. 7A–E illustrate a process for fabricating an MRAM element with a magnetic keeper. In particular, the exemplary process relates to fabricating the element that is similar to the element 302 described above in reference to FIG. 2. It will be appreciated that the process described can be modified to fabricate other embodiments of the MRAM element without departing from the spirit of the invention. The process is illustrated and described in context of a single element. It will be appreciated, however, that in practice, such process is generally performed at an array level such that the result of the array fabrication process is similar to the array 312 of FIG. 6.

Figure 7A:
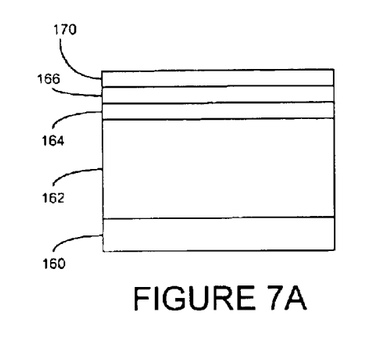
FIG. 7 illustrates one possible method of fabricating an MRAM element similar to that of FIG. 2.

As shown in FIG. 7A, one implementation of process of forming an MRAM element with magnetic keeper begins with a dielectric layer 162 being formed on top of an underlayer 160. The dielectric layer 162 is formed using one of known methods and provides structural support for various features formed thereon. A first barrier layer 164 is formed on top of the dielectric layer 162 using a known method such as a physical vapor deposition (PVD). In one embodiment, the first barrier layer 164 is a titanium tungsten (TiW) layer with a preferred thickness in a range of approximately 100–2000 angstroms, and more preferably approximately 300 angstroms. The barrier layer 164 forms a protective barrier for the dielectric layer 162 during a patterning process described below. The barrier layer 164 further acts as an adhesion promoting layer that facilitates deposition of material on its top described below.

As seen in FIG. 7A, a magnetic keeper layer 166 is formed on top of the barrier layer 164 using a deposition method such as PVD. In one embodiment, the magnetic keeper layer 166 is a soft magnetic material such as nickel iron (NiFe), nickel iron cobalt (NiFeCo), cobalt iron (CoFe), and the like. The thickness of the magnetic keeper layer 166 is preferably in a range of approximately 100–1000 angstroms. While a thickness of approximately 100 angstroms is generally considered to be enough, a more preferable thickness is approximately 200 angstroms. A masking layer 170 is then formed on top of the magnetic keeper layer 166. In one embodiment, the masking layer 170 is a tantalum nitride layer with a thickness selected to provide masking function during an etching process described below.

Figure 7B:
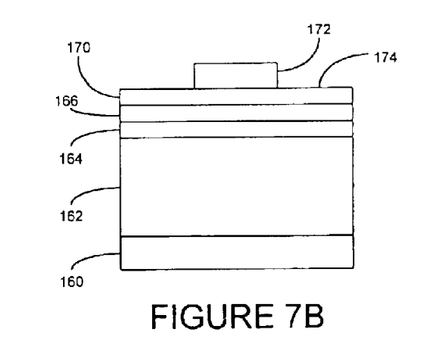
Figure 7C:
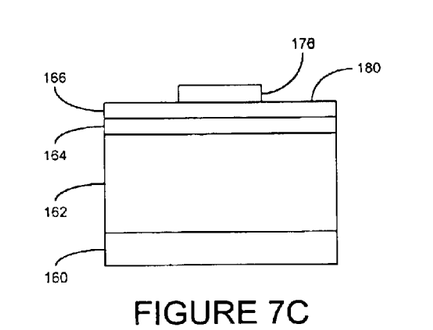

As seen in FIG. 7B, the masking layer 170 defines a top surface 174 on which a photo resist mask 172 is formed. The mask 172 covers a selected portion of the top surface 174 such that underlying area beneath the mask 172 remains intact during a known photo-lithography and etching processes that remove the unmasked portion of the masking layer 170. In FIG. 7C, the result of the photo-lithography and etching process is illustrated wherein a masking strip 176 is formed on a top surface 180 defined by the magnetic keeper layer 166. In one implementation, the etching of the masking layer to form the masking strip 176 is performed by a plasma etching method.

Figure 7D:
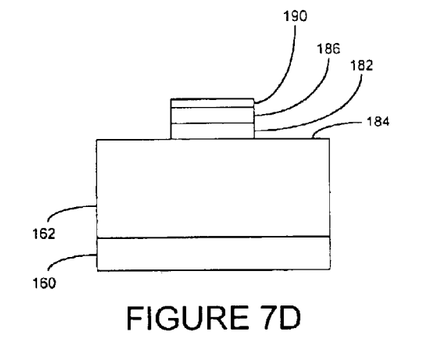

FIG. 7D illustrates further etching wherein unmasked portions of the magnetic keeper layer 166 and the underlying barrier layer 164 are removed so as to expose a top surface 184 of the dielectric layer 162. The masked portions, masked by the masking strip 176, of the magnetic keeper layer and the barrier layer thus become a magnetic keeper strip 186 and a barrier strip 182. In one embodiment, the thickness of the masking strip 176 is reduced in the etching process so as to yield a reduced thickness masking strip 190. In one implementation, the etching is performed by a sputter etching process. In another implementation, removal of material is achieved by an ion milling process. The shape of the magnetic keeper strip 186 is determined by the thickness of the previously described thickness of the magnetic keeper layer 166 and the masking shape of the masking strip 176.

Figure 7E:
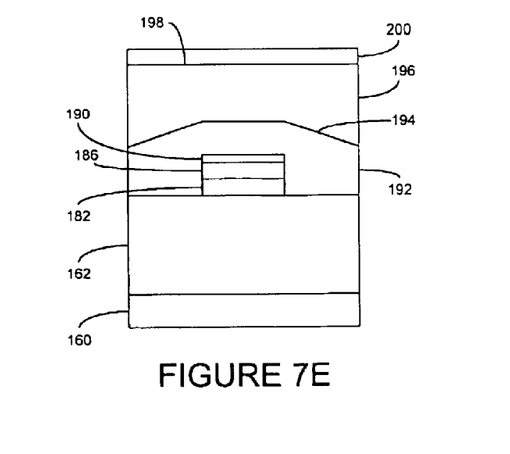

As illustrated in FIG. 7E, in one embodiment, a keeper barrier and adhesion layer 192 is deposited about the stack of the barrier strip 182, the magnetic keeper strip 186, and the reduced thickness masking strip 190. The deposited keeper barrier and adhesion layer 192 defines a top contour 194 that in one embodiment is generally flat above the stack of strips and slopes downward on either sides. In one embodiment, the keeper barrier and adhesion layer 192 comprises materials such as titanium tungsten or titanium nitride that facilitate formation of a conductor 196 (word line) on top of the contour 194. In one embodiment, the conductor 196 material comprises aluminum copper (AlCu). In one embodiment, the top of the conductor 196 is planarized so as to define a planar surface 198. An anti-reflective coating (ARC) layer 200 is then formed on the planar surface 198 of the conductor 196. Preferably, the ARC layer 200 comprises a selected thickness layer of TiW. The ARC layer 200 facilitates formation thereon of additional barrier and support layers, as well as an MRAM bit previously described above in reference to FIG. 2. Specifically, layers similar to the second barrier layer 104 (FIG. 2) and the second substrate layer 102 are formed on top of the AR coated conductor 196, and the bit 100 is formed on top of the second substrate layer 102 in known manners. It will be appreciated that the fabrication process described above in reference to FIGS. 7A–E may be modified to fabricate other embodiments of the magnetic keeper/bit configurations described above.

In one aspect, the magnetic keepers described above, in addition to reducing the extent of the fringe fields, also concentrate the magnetic field at the bit location. As a consequence of this increased field density due to the keeper, an MRAM bit located at a given location relative to a word line (conductor) may be serviced by a lower current than that of a similar configuration without the keeper. This advantageous feature is described below in reference to illustrations in FIGS. 8A–C.

Figures 8A, 8B:
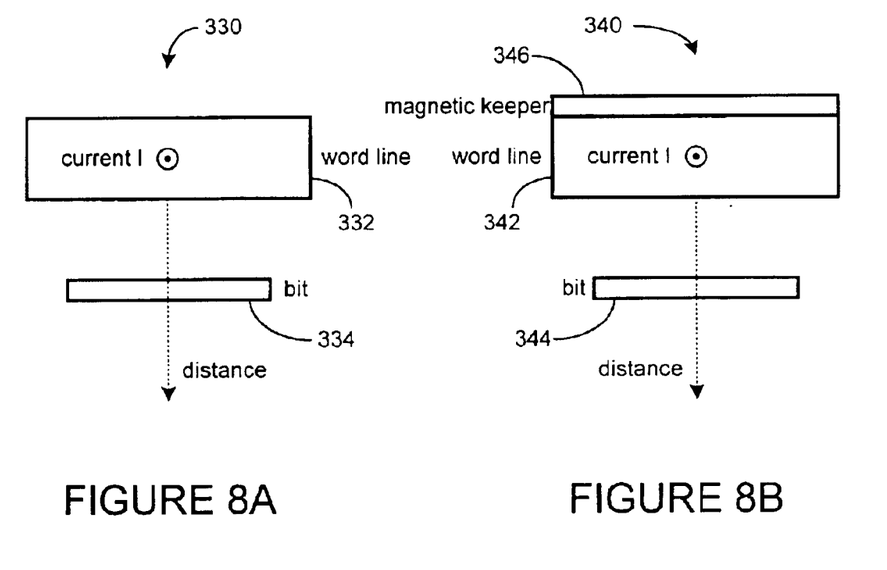
FIGS. 8A–C illustrate an increase in the magnetic field strength at the bit location by having the magnetic keeper adjacent to the conductor.

FIG. 8A illustrates a cross section of selected components of an MRAM element 330 comprising a bit 334 located at a selected distance from a word line 332. A current I flows through the word line 332 in an exemplary direction (out of the plane), resulting in a magnetic field such as that shown in FIG. 1. FIG. 8B illustrates a cross section of selected components of an MRAM element 340 having a magnetic keeper 346 adjacent to a word line 342. A bit 344 is located at a similar distance from the word line 342 as that of the element 330 described above in reference to FIG. 8A. A current I flows through the word line 342, resulting in a magnetic field similar to that shown in FIG. 4.

Figure 8C:
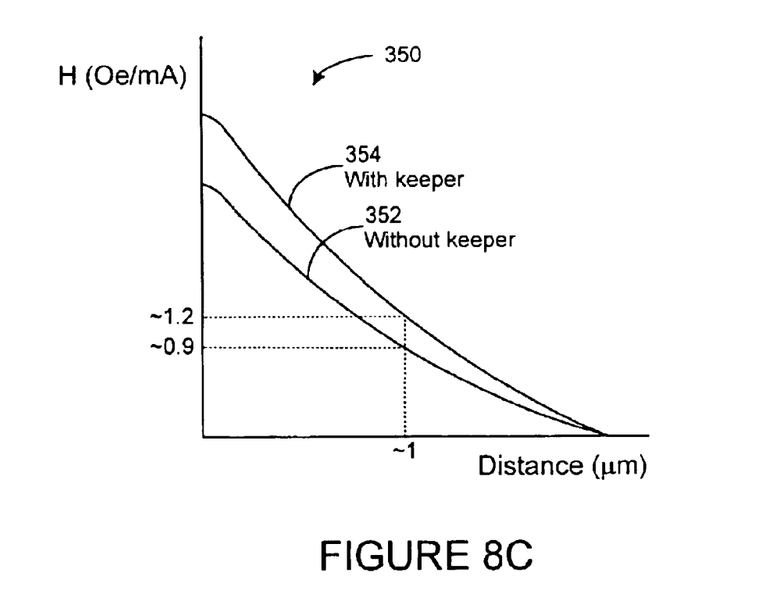

FIG. 8C illustrates a simulated comparison of magnetic field strengths at the bits 334 and 344 due to the currents I flowing through the respective word lines 332 and 342. A comparison plot 350 illustrates the magnetic field strength as a function of distance from the word line along the "distance" line of FIGS. 8A and B. For the simulation, the word lines 332 and 342 have a cross sectional dimension of approximately 3.5 μm×1.0 μm, and the bits 334 and 344 are positioned approximately 1 μm from their respective word lines. Curves 352 and 354 depict the dependence of magnetic field strength H on distance without and with the magnetic keeper, respectively, due to a substantially same current. At the approximately 1 μm distance, the value of H is approximately 0.9 Oe/mA for the word line 332 without the keeper, while for the word line 342 with the keeper, the value of H is approximately 1.2 Oe/mA, an increase by approximately 33%.

Thus it can be seen that for a given current, the magnetic keeper increases the magnetic field strength at the bit. Consequently, for an MRAM element configured in a similar manner as that without the keeper, a lower current can be supplied to yield a similar field strength. This lower current requirement advantageously results in a lower power consumption of the MRAM element.

Although the various embodiments of the invention have shown, described and pointed out the fundamental novel features, it will be understood that various omissions, substitutions and changes in the form of the detail of the device illustrated may be made by those skilled in the art without departing from the spirit of the invention. Consequently, the scope of the invention should not be limited to the foregoing description, but should be defined by the appending claims.

What is claimed is:

1. An MRAM device comprising:
   an MRAM bit having a magnetoresistive material whose electrical resistance depends on the magnetization of the magnetoresistive material wherein the change in the resistance permits the bit to be in different states;
   a magnetic field generating member positioned adjacent the bit wherein the magnetic field generating member is capable of generating a magnetic field that alters the magnetization of the bit, wherein the magnetic field generating member comprises a conductor that permits an electrical current to flow therethrough thereby generating the magnetic field; and
   a magnetic keeper member positioned adjacent the magnetic field generating member, the magnetic keeper member adapted to shape the pattern of the magnetic field generated by the magnetic field generating member, wherein the magnetic keeper member comprises a soft magnetic material that captures and concentrates the magnetic field therein so as to alter the overall magnetic field pattern generated by the magnetic field generating member, wherein the soft magnetic material captures and concentrates the magnetic field therein by having a relatively higher magnetic permeability value than that of its surrounding materials, wherein the magnetic permeability of the soft magnetic material is approximately 100 times or higher than that of its surrounding material; and
   a keeper barrier layer disposed at least between the magnetic field generating member and the magnetic keeper member, wherein the keeper barrier layer also covers sides of the magnetic keeper member.

2. The MRAM device of claim 1, wherein the magnetic field pattern altered by the magnetic keeper member has a reduced fringe magnetic field relative to a fringe magnetic field without the magnetic keeper.

3. The MRAM device of claim 2, wherein the soft magnetic material comprises nickel iron (NiFe).

4. The MRAM device of claim 2, wherein the soft magnetic material comprises nickel iron cobalt (NiFeCo).

5. The MRAM device of claim 2, wherein the soft magnetic material comprises cobalt iron (CoFe).

6. The MRAM device of claim 2, wherein the magnetic keeper member has a thickness in the range of approximately 100–1000 angstroms.

7. The MRAM device of claim 6, wherein the magnetic keeper member has a thickness of approximately 200 angstroms.

8. The MRAM device of claim 1, wherein the magnetic keeper member and the MRAM bit are disposed on opposite sides of the conductor.

9. The MRAM device of claim 1, wherein the magnetic keeper member forms a U-shape about the conductor in cross section wherein the U-shaped magnetic keeper member comprises a base section and two side sections and wherein the MRAM bit is disposed adjacent the side of the conductor that is opposite from the base section of the U-shaped magnetic keeper member.

10. The MRAM device of claim 1, wherein the keeper barrier and adhesion layer comprises titanium tungsten (TiW).

11. The MRAM device of claim 1, wherein the keeper barrier and adhesion layer comprises titanium nitride (TiN).

12. The MRAM device of claim 1, wherein the magnetic field generating member comprises aluminum copper (AlCu).

13. An MRAM array comprising:
    a plurality of MRAM bits arranged in a selected manner;
    a plurality of conductors adapted to carry current therethrough wherein a current flowing through a conductor generates a magnetic field and wherein the plurality of conductors are arranged such that the magnetic field can be applied to a selected MRAM bit so as to alter the state of the selected MRAM bit, wherein each conductor has associated with it a corresponding magnetic keeper member;
    a plurality of magnetic keeper members positioned adjacent corresponding conductors such that the magnetic keeper members shape the magnetic field generated by the conductors so as to permit improved arrangement of the MRAM bits and the conductors in the MRAM array, wherein the magnetic keeper members comprises a soft magnetic material and wherein the magnetic keeper member extends in a generally parallel manner to the conductor, wherein the soft magnetic material provides a preferred path for the magnetic field by having a higher value of relative magnetic permeability than that of its surrounding material, wherein the magnetic permeability of the soft magnetic material is approximately 100 times or higher than that of its surrounding material; and
    a plurality of keeper barriers disposed between corresponding conductors and magnetic keeper members, wherein the keeper barriers covers sides and tops of the corresponding magnetic keeper members.

14. The MRAM array of claim 13, wherein the soft magnetic material comprises nickel iron (NiFe).

15. The MRAM array of claim 13, wherein the soft magnetic material comprises nickel iron cobalt (NiFeCo).

16. The MRAM array of claim 13, wherein the soft magnetic material comprises cobalt iron (CoFe).

17. The MRAM array of claim 13, wherein the keeper barriers comprises titanium tungsten (TiW).

18. The MRAM array of claim 13, wherein the keeper barriers comprise titanium nitride (TiN).

19. The MRAM array of claim 13, wherein the conductors comprise aluminum copper (AlCu).

20. The MRAM array of claim 13, wherein the magnetic keeper members further comprise a plurality of two side sections disposed adjacent to sides of corresponding conductors.

21. An MRAM device comprising:
    an MRAM bit having a magnetoresistive material whose electrical resistance depends on the magnetization of the magnetoresistive material wherein the change in the resistance permits the bit to be in different states;
    a conductor positioned adjacent the bit wherein a current flowing through the conductor generates a flux of magnetic field at a location occupied by the bit and wherein a magnetic field flux greater than a first value alters the magnetization of the bit;
    a magnetic keeper member positioned adjacent the conductor such that the magnetic keeper member increases the magnetic field flux at the bit location than without the magnetic keeper member, wherein the magnetic keeper member comprises a soft magnetic material that captures and concentrates the magnetic field therein so as to alter the overall magnetic field pattern generated by the conductor, wherein the soft magnetic material captures and concentrates the magnetic field therein by having a relatively higher magnetic permeability value than that of its surrounding materials, wherein the magnetic permeability of the soft magnetic material is approximately 100 times or higher than that of its surrounding material; and a keeper barrier layer covering sides and a top of the magnetic keeper member, where at least a portion of the keeper barrier layer is further disposed between the conductor and the magnetic keeper member.

22. The MRAM device of claim 21, wherein the soft magnetic material comprises nickel iron (NiFe).

23. The MRAM device of claim 21, wherein the soft magnetic material comprises nickel iron cobalt (NiFeCo).

24. The MRAM device of claim 21, wherein the soft magnetic material comprises cobalt iron (CoFe).

25. The MRAM device of claim 21, wherein the magnetic keeper member has a thickness in the range of approximately 100–1000 angstroms.

26. The MRAM device of claim 25, wherein the magnetic keeper member has a thickness of approximately 200 angstroms.

27. The MRAM device of claim 21, wherein the magnetic keeper member and the MRAM bit are disposed on opposite sides of the conductor.

28. The MRAM device of claim 21, wherein the magnetic keeper member forms a U-shape about the conductor in cross section wherein the U-shaped magnetic keeper member comprises a base section and two side sections and wherein the MRAM bit is disposed adjacent the side of the conductor that is opposite from the base section of the U-shaped magnetic keeper member.

29. The MRAM device of claim 21, wherein the keeper barrier and adhesion layer comprises titanium tungsten (TiW).

30. The MRAM device of claim 21, wherein the keeper barrier and adhesion layer comprises titanium nitride (TiN).

31. The MRAM device of claim 21, wherein the conductor comprises aluminum copper (AlCu).

32. An MRAM device comprising:

an MRAM bit having a magnetoresistive material whose electrical resistance depends on the magnetization of the magnetoresistive material wherein the change in the resistance permits the bit to be in different states;

a conductor positioned at a first distance from the bit wherein a current flowing through the conductor generates a magnetic field flux at the bit location and alters the magnetization of the bit if the flux is greater than a first amount;

a flux concentrator component configured to concentrate the magnetic field flux therein thereby also increasing the flux at the bit location, wherein the flux concentrator comprises a soft magnetic material layer adjacent to the conductor on the side away from the bit, wherein the soft magnetic material provides a preferred path for the magnetic field by having a higher value of relative magnetic permeability than that of its surrounding material and wherein the magnetic permeability of the soft magnetic material is approximately 100 times or higher than that of its surrounding material; and a keeper barrier layer disposed at least between the conductor and the flux concentrator component, wherein the keeper barrier layer is further disposed along sides of the magnetic keeper member.

33. The MRAM device of claim 32, wherein the soft magnetic material layer comprises a layer that has a thickness in the range of approximately 100–1000 angstroms.

34. The MRAM device of claim 33, wherein the thickness is approximately 200 angstroms.

35. The MRAM device of claim 33, wherein the soft magnetic material layer comprises a layer of nickel iron (NiFe).

36. The MRAM device of claim 33, wherein the soft magnetic material layer comprises a layer of nickel iron cobalt (NiFeCo).

37. The MRAM device of claim 33, wherein the soft magnetic material layer comprises a layer of cobalt iron (CoFe).

38. The MRAM device of claim 32, wherein the keeper barrier and adhesion layer comprises titanium tungsten (TiW).

39. The MRAM device of claim 32, wherein the keeper barrier and adhesion layer comprises titanium nitride (TiN).

40. The MRAM device of claim 32, wherein the conductor comprises aluminum copper (AlCu).

41. The MRAM device of claim 32, wherein the flux concentrator component further comprises two side sections disposed adjacent to sides of the conductor.

* * * * *